United States Patent
Yoshikawa

[19]

[11] Patent Number: 6,012,833
[45] Date of Patent: Jan. 11, 2000

[54] LARGE-SCALE-INTEGRATION CIRCUIT DEVICE AND METHOD OF MANUFACTURING SAME

[75] Inventor: Satoru Yoshikawa, Kawasaki, Japan

[73] Assignee: Fujitsu Limited, Kawasaki, Japan

[21] Appl. No.: 08/878,080

[22] Filed: Jun. 18, 1997

[30] Foreign Application Priority Data

Nov. 29, 1996 [JP] Japan ..................... 8-318928
Feb. 24, 1997 [JP] Japan ..................... 9-038932

[51] Int. Cl.$^7$ ..................................... G06F 19/00
[52] U.S. Cl. ........................ 364/468.28; 708/190
[58] Field of Search ................ 364/468.28, 712, 364/488–491; 708/190

[56] References Cited

U.S. PATENT DOCUMENTS

| | | | |
|---|---|---|---|
| 4,849,904 | 7/1989 | Aipperspach et al. ............... | 364/489 |
| 4,924,430 | 5/1990 | Zasio et al. ....................... | 364/488 |
| 4,954,953 | 9/1990 | Bush ................................. | 364/489 |
| 5,119,314 | 6/1992 | Hotta et al. ....................... | 364/489 |
| 5,274,568 | 12/1993 | Blinne et al. ..................... | 364/490 |
| 5,333,032 | 7/1994 | Matsumoto et al. ................ | 364/489 |
| 5,363,381 | 11/1994 | Hasegawa ......................... | 371/22.1 |
| 5,397,749 | 3/1995 | Igarashi ........................... | 364/490 |
| 5,515,291 | 5/1996 | Omori et al. . | |
| 5,572,437 | 11/1996 | Rostoker et al. .................. | 364/489 |
| 5,617,325 | 4/1997 | Schaefer .......................... | 364/490 |
| 5,774,371 | 6/1998 | Kawakami ........................ | 364/489 |

OTHER PUBLICATIONS

Patent Abstracts of Japan; Publication No. 02265268, Publication Date Oct. 30, 1990; Application Date Apr. 5, 1989; Application No. 01087509; (NEC Corp).
Patent Abstracts of Japan; Publication No. 04372169, Publication Date Dec. 25, 1992; Application Date Jun. 21, 1991; Application No. 03150253; (Mitsubishi Electric Corp).
Patent Abstracts of Japan; Publication No. 04345051, Publication Date Dec. 1, 1992; Application Date May 22, 1991; Application No. 03117641; (Toshiba Micro Electron KK).
Patent Abstracts of Japan; Publication No. 07014927, Publication Date Jan. 17, 1995; Application Date Jun. 21, 1993; Application No. 05148974; (Toshiba Micro Electron KK).

*Primary Examiner*—William Grant
*Assistant Examiner*—Chad Rapp
*Attorney, Agent, or Firm*—Staas & Halsey

[57] ABSTRACT

A method of manufacturing an integration circuit device that includes generating logic library data with respect to a macro that includes a predetermined macro core and boundary cells positioned near input and output terminals of the macro. The logic library data includes delay characteristic data of the boundary cells given as attribute data to the input and output terminals. A logic circuit, that includes a plurality of cells and the macro, is designed, with the cells being connected to the macro core through the boundary cells connected to the input and output terminals. A delay time of the macro is calculated based on the delay characteristic data with respect to the designed logic circuit. A logic simulation on the designed logic circuit is effected based on the calculated delay time.

9 Claims, 12 Drawing Sheets

LSI FABLICATION FLOW CHART

LSI DESIGN SYSTEM

LOGIC LIBRARY FLOW CHART

Tpd : Pass delay time
Tsin 1, 2, 3 : Input slew rate
CL : Load capacitance
Tsout : Output slew rate

BOUNDARY CELL CONNECTED TO
INPUT TERMINAL OF MACRO

BOUNDARY CELL CONNECTED TO
OUTPUT TERMINAL OF MACRO

FIG. 14
DATA OF LOGIC LIBRARY

CELL A
- A1. LOGIC DATA
- A2. INPUT TERMINAL CAPACITANCE (EACH INPUT TERMINAL)
- A3. OUTPUT DRIVE CAPABILITY (EACH OUTPUT TERMINAL)
- A4. DELAY TIME TABLE DEPENDING ON INPUT SLEW RATE (EACH PATH)

CELL B
- B1. LOGIC DATA
- B2. INPUT TERMINAL CAPACITANCE (EACH INPUT TERMINAL)
- B3. OUTPUT DRIVE CAPABILITY (EACH OUTPUT TERMINAL)
- B4. DELAY TIME TABLE DEPENDING ON INPUT SLEW RATE (EACH PATH)

CELL C
- C1. LOGIC DATA
- C2. INPUT TERMINAL CAPACITANCE (EACH INPUT TERMINAL)
- C3. OUTPUT TERMINAL CAPABILITY (EACH OUTPUT TERMINAL)
- C4. DELAY TIME TABLE DEPENDING ON INPUT SLEW RATE (EACH PATH)

MACRO D (34)
- D1. LOGIC DATA
- D2. CHARACTERISTIC PARAMETER FOR DELAY TIME CALCULATION (EACH INPUT TERMINAL)
- D3. OUTPUT DRIVE CAPABILITY (EACH OUTPUT TERMINAL)
- D4. BASIC DELAY TIME
  - D41. BASIC DELAY TIME OF INPUT BOUNDARY CELLS 1, 2
  - D42. DELAY TIME OF OUTPUT BOUNDARY CELL 3
  - D43. DELAY TIME OF MACRO CORE
  - D43. DELAY TIME OF OUTPUT INTERCONNECTION T LINE R

LARGE-SCALE-INTEGRATION CIRCUIT DEVICE AND METHOD OF MANUFACTURING SAME

BACKGROUND OF THE INVENTION

1. Field of the Invention

The present invention relates to a large-scale-integration (LSI) circuit device and a method of manufacturing same, and more particularly to a delay time calculation process to be carried out in a logic simulation process in the design of LSI circuits.

2. Description of the Prior Art

As a result of semiconductor fine-circuitry fabrication technology advances in recent years, LSI circuits are experiencing larger scale integration. As a result, it is now possible to incorporate system functions in one chip. For example, a function macro which has heretofore been constructed as one chip is now incorporated together with other logic circuits in a single chip. Such a function macro includes functions of a single chip, including a CPU, multipliers, microcomputer peripherals, etc. An ordinary function macro is a relatively large circuit having a plurality of cells and memories comprise gates and flip-flops.

Many function macros standardized for the LSI circuit industry are available. The function macros include function macros uniquely designed by manufacturers of LSI circuits and function macros designed by various designing companies and sold in the market. These function macros are now a type of black box that users will find satisfactory if they perform desired functions, and are not concerned with internal structural details.

However, function macros that are available have raised a new problem in that delay time calculations cannot accurately be made in a logic simulation process required in the design of LSI circuits. Specifically, the LSI circuit fabrication procedure primarily comprises a process of designing an LSI circuit and confirming its operation through a logic simulation process, a process of designing an actual LSI mask pattern, and a process of fabricating a semiconductor wafer using the LSI mask pattern to produce LSI chips.

The logic simulation process is an indispensable process for making the process of fabricating a semiconductor wafer effective, which is highly costly to carry out. In the logic simulation process, logic operations of cells and macros in a chip are confirmed. More specifically, delay times of the cells and macros which are connected as circuits are calculated, and their logic operations are simulated and confirmed on the basis of the calculated delay times.

It is difficult to calculate the delay time of a function macro available as a black box. A function macro which is of large scale by itself has a basic internal delay time that is essentially determined when the function macro is designed. However, the delay time of an input stage of the function macro varies depending on the slew rate of a signal inputted to an input terminal of the function macro, and the delay time of an output stage of the function macro varies depending on the capacitance of a load connected to an output terminal of the function macro. These delay time variations are caused by delay times of cells depending on the slew rate of the inputted signal, the slew rate of an outputted signal, delay times of interconnections, and delay times due to different levels for deciding delay of signals, which heretofore have not been taken into account, but have to be considered due to finer circuitry schemes. The delay time variations are closely related to the fact that function macros are incorporated in chips.

If the delay time variations are accurately calculated and added to the basic internal delay time, then it is possible to accurately calculate the entire delay time of the macro in the chip. However, the input stage of a macro has a circuit configuration that differs from macro to macro, and the output stage thereof also has a circuit configuration that differs from macro to macro. Accordingly, when a logic circuit is designed using commercially available macros, it is not an easy task to calculate their delay times with accuracy.

SUMMARY OF THE INVENTION

It is therefore an object of the present invention to provide a large-scale-integration circuit device and a method of manufacturing such a large-scale-integration circuit device efficiently based on a process of modeling a macro to allow a circuit designing engineer to accurately calculate the delay time of the macro.

To achieve the above object, there is provided in accordance with the present invention a method of manufacturing a large-scale-integration circuit device, comprising the steps of generating logic library data with respect to a macro comprising a macro core having a predetermined function and boundary cells positioned near input and output terminals thereof, the logic library data including delay characteristic data of the boundary cells given as attribute data to the input and output terminals; designing a logic circuit having at least a plurality of cells and the macro, the cells being connected to the macro core through the boundary cells connected to the input and output terminals; calculating a delay time of the macro based on the delay characteristic data with respect to the designed logic circuit; and effecting a logic simulation on the designed logic circuit based on the calculated delay time.

The delay characteristic data comprises data of delay time characteristics depending on the slew rate of an input signal. The data of delay time characteristics comprises a characteristic parameter required to calculate the delay time. The data of delay time characteristics comprises delay time characteristics matched to a decision level for determining a delay time of one of the cells which is connected to the input terminal and a decision level for determining a delay time of the macro core.

The delay characteristic data comprises data of an output drive capability. The data of the output drive capability comprises data of the slew rate of an output signal depending on the slew rate of an input signal and a load capacitance, and a delay time depending on the slew rate of the input signal and the load capacitance. The data of the output drive capability comprises delay time characteristics matched to a decision level for determining a delay time of one of the cells which is connected to the output terminal and a decision level for determining a delay time of the macro core.

According to the present invention, there is also provided a large-scale-integration circuit device comprising a plurality of cells and a macro having a predetermined function, the macro comprising a plurality of input terminals and output terminals, a macro core having the predetermined function, and a plurality of boundary cells positioned between the input terminals, the output terminals, and the macro core, and connected to the input terminals and the output terminals, the cells being connected to the macro core through the boundary cells, respectively.

The above and other objects, features, and advantages of the present invention will become apparent from the following description when taken in conjunction with the accompanying drawings which illustrate a preferred embodiment the present invention by way of example.

BRIEF DESCRIPTION OF THE DRAWINGS

FIG. 14 shows by way of example a data structure in a logic library.

DETAILED DESCRIPTION OF THE PREFERRED EMBODIMENT

Figure 1:
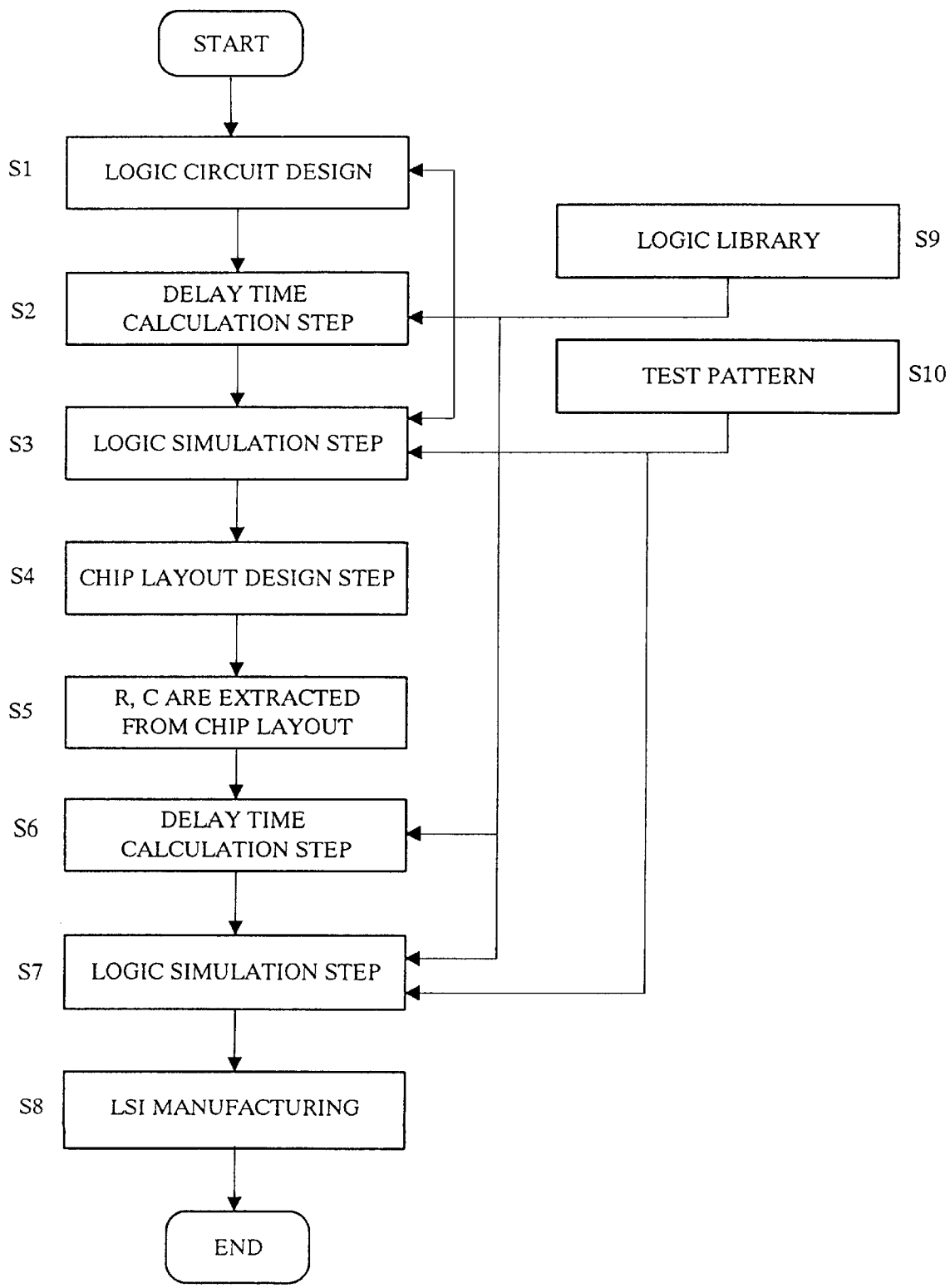
FIG. 1 is a flowchart of an operation sequence of an LSI fabrication process.

FIG. 1 shows an operation sequence of an LSI fabrication process. According to the LSI fabrication process shown in FIG. 1, the logic circuit of an LSI circuit to be fabricated is designed in a step S1. In the step S1, a plurality of types of cells and macros from a logic library are arranged and connected to design the logic circuit. Then, delay times in the designed logic circuit are calculated in a step S2. The delay times are usually calculated by a computer according to a tool known as a delay time calculation program. For calculating the delay times, delay characteristics of the cells and macros of the logic circuit or parameters for the calculation of the delay time are taken from the logic library and used. For example, an input signal slew rate depending on the output drive capability of a preceding cell or macro is calculated, and the delay time of a cell or macro is determined from the input signal slew rate and the above delay characteristics.

After the delay times are calculated, a logic simulation of the logic circuit is carried out on the basis of the calculated delay time in a step S3. The logic simulation is performed according to a simulation program. The logic simulation employs a test pattern comprising an input pattern produced by the person who has designed the logic circuit and a corresponding output pattern which is expected. In the logic simulation, it is checked whether the logic circuit effects expected logic operations or not on the assumption that the cells and macros operate with the delay times determined in the step S2, i.e., whether a pattern outputted with respect to the input pattern agrees with the expected output pattern or not.

If the logic circuit passes the logic check in the step S3, then a specific chip layout is generated according to the layout patterns of the cells and macros in a step S4. Thereafter, accurate resistance and capacitance values are extracted from the chip layout in a step S5. Based on the resistance and capacitance values, delay times are calculated again in a step S6, and then a logic simulation is conducted on the logic circuit in a step S7. These steps S6, S7 are carried out in order to effect an accurate operation check based on the chip layout. After the logic circuit passes the logic check in the step S7, an LSI circuit is manufactured in a step S8.

As described above, it is necessary in the fabrication of LSI circuits to extract characteristics of cells and macros which make up logic circuits, particularly characteristics and parameters required to calculate delay times and characteristics and parameters required for logic simulations, and store the extracted characteristics and parameters as a logic library. The logic library is produced in a step S9. The test pattern used in the step S3 is produced in a step S10.

Figure 2:
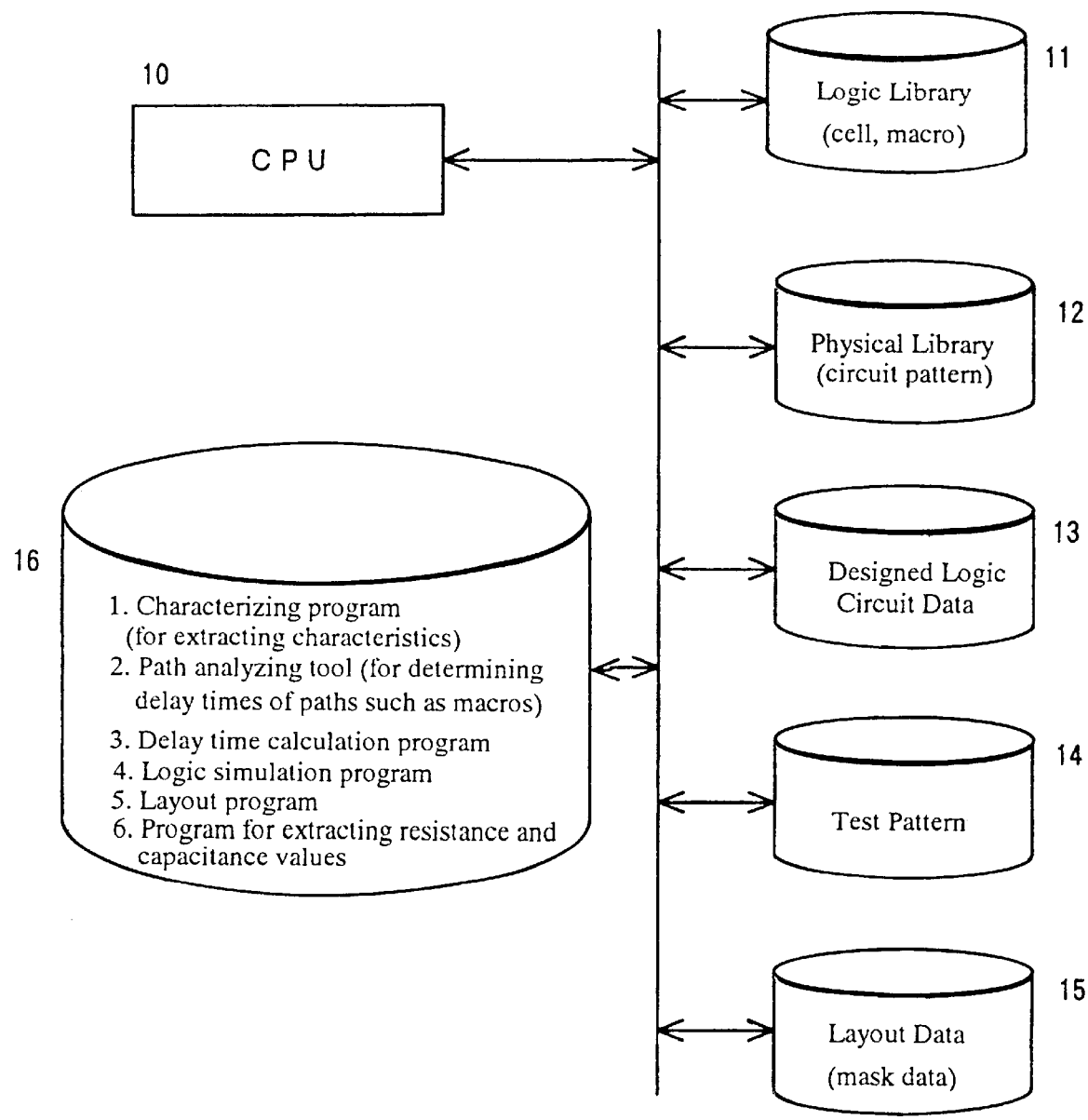
FIG. 2 is a bloc diagram of an LSI designing system.

FIG. 2 shows an LSI designing system in block form. As shown in FIG. 2, the LSI designing system has a CPU 10 to which various files 11~16 are accessibly connected. The files 11~16 include a file 11 containing the logic library, a file 12 containing a physical library of circuit patterns of cells and macros, a file 13 of designed logic circuit data, a file 14 of test patterns, and a file 15 of layout data which are generated by applying a circuit pattern from the physical library to designed logic circuit data.

The LSI designing system also has a design tool file 16 connected to the CPU 10 and the files 11~16. The design tool file 16 contains design tools including a characterizing program for extracting characteristics of cells and macros and parameters, a path analyzing tool for determining delay times of paths such as macros, a delay time calculation program, a logic simulation program, a layout program, and a program for extracting resistance and capacitance values from a chip layout.

Aspects to be considered in the calculation of delay times in view of circuit integration at higher densities and also aspects to be considered in the incorporation of a macro into a circuit of ordinary cells will be described below.

Figure 3A:
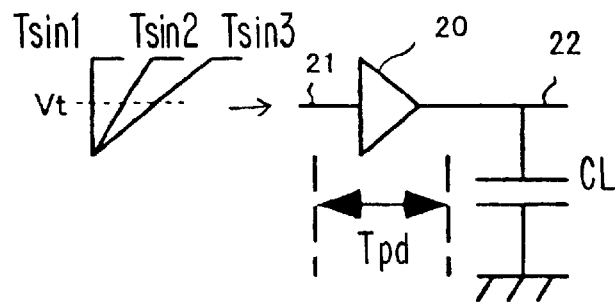
FIGS. 3(a) and (b) are diagrams illustrative of the delay time of a cell depending on the slew rate of an inputted signal and an output capacitance.
Figure 3B:
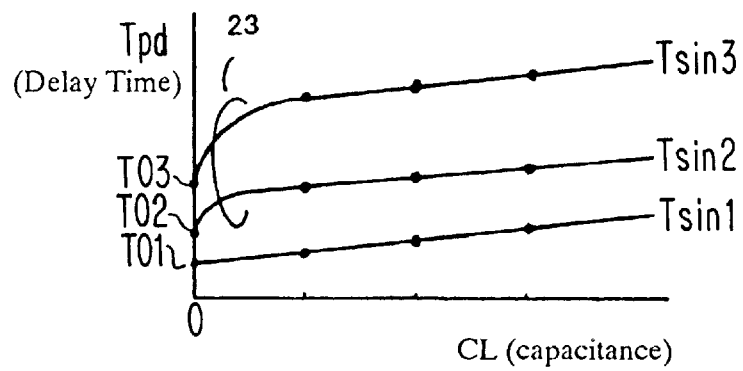

FIGS. 3A and 3B are illustrative of the delay time of a cell depending on the slew rate of an inputted signal and an output capacitance. The dependency of the delay time on the slew rate of an inputted signal needs to be considered in the calculation of delay times because of advances in the fine-circuitry fabrication technology. In FIG. 3A, inputted signals Tsin1, Tsin2, Tsin3 having different rising edges are applied to an input terminal 21 of a cell 20, and a load capacitance CL is connected to an output terminal 22 of the cell 20. The slew rate of an inputted signal is a time required for the inputted signal to rise to a certain level. If an input signal rises sharply, the slew rate thereof is smaller, and if an input rises slowly, the slew rate thereof is larger.

FIG. 3B shows delay times Tpd of the cell 20 with respect to the inputted signals Tsin1, Tsin2, Tsin3. As the load capacitance Cl connected to the output terminal 22 increases, the delay times Tpd also increase. At the different slew rates of inputted signals, the levels of the inputted signals reach a threshold Vt at which a transistor in the cell 20 is reversed, at different times. When the inputted signal rises slowly, an incomplete ON-state of a drive transistor in the cell becomes longer, making the delay time curves relatively dull as indicated at 23 in FIG. 3B. As the load capacitance increases, the incomplete stage of the drive transistor becomes longer and the delay time Tpd becomes greater for the inputted signal Tsin3 with a relatively large slew rate. As the load capacitance increases further, the delay time is simply proportional to the capacitance value. The characteristics shown in FIG. 3B vary depending on the cell.

With the cell 20 incorporated in a logic circuit, the slew rate of a signal inputted to the input terminal of the cell 20 is determined on the basis of the drive capability of a preceding cell and the condition of circuit connections, and the delay time of the cell varies depending on the slew rate of the inputted signal. This holds true for the load capacitance. The characteristics of the cell 20 dictate that parameters or delay time characteristics as shown in FIG. 3B required to calculate delay times thereof be determined in advance for each input/output path and registered. The parameters may, for example, be α values given below, and it is possible to calculate delay times when such α values are given.

$$\alpha1=(T02-T01)/(Tsin2-Tsin1)$$

$$\alpha2=(T03-T02)/(Tsin3-Tsin2)$$

The delay time characteristics shown in FIG. 3B may be represented by a table of data indicative of the values of dots in FIG. 3B.

Figure 4:
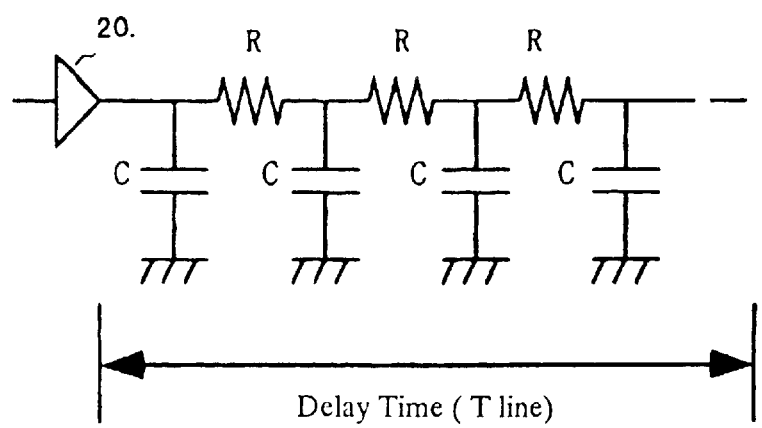
FIG. 4 is a circuit diagram illustrative of a delay time caused by interconnections.

FIG. 4 is illustrative of a delay time Tline caused by interconnections. As the fine-circuitry fabrication technology has advanced, circuit elements are packed at higher densities in a chip and interconnections have smaller widths, with the results that the interconnections take up an area having a greater proportion compared with the area of cells, and delay times caused by the interconnections are comparatively not negligible. As shown in FIG. 4, a delay time caused by interconnections becomes larger in proportion to resistances R and parasitic capacitances C of the interconnections.

Figure 5:
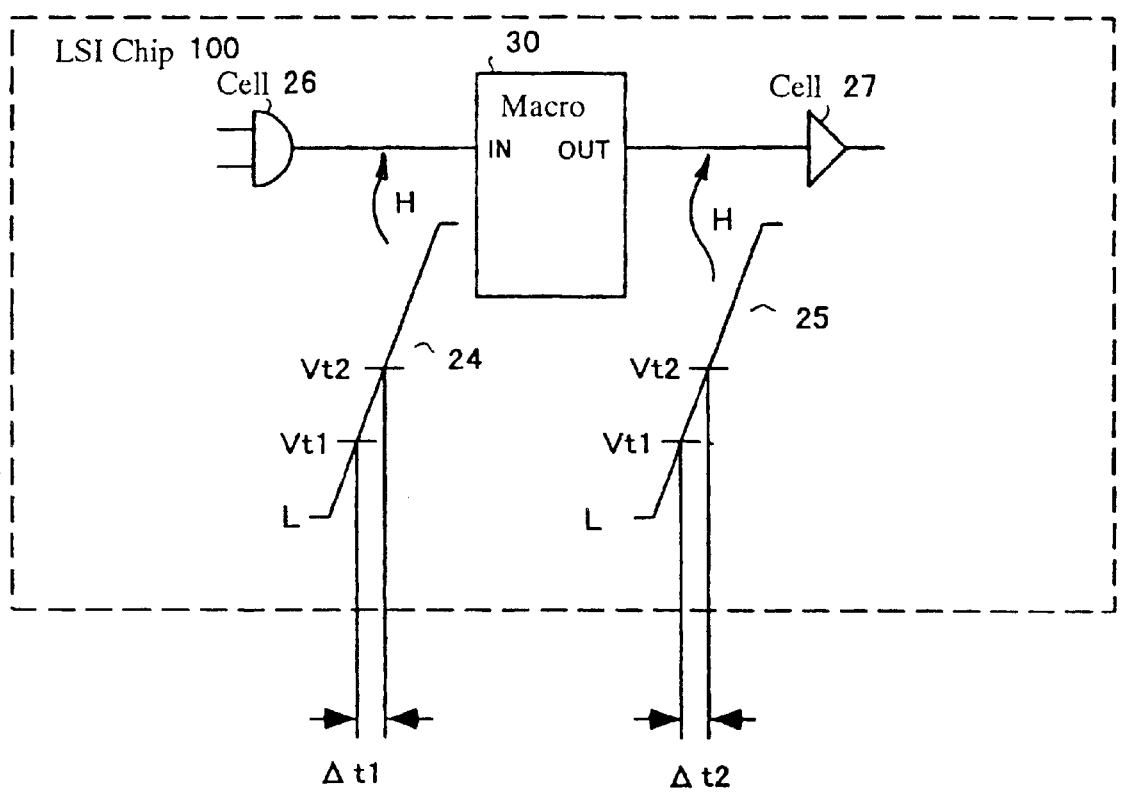
FIG. 5 is a block diagram illustrative of delay time errors at the junctions between cells and a macro connected thereto.

FIG. 5 is illustrative of delay time errors at the junctions between cells and a macro connected thereto. As shown in FIG. 5, cells 26, 27 and a macro 30 are connected to each other in an LSI chip 100. The delay times of various macros available in the market which are manufactured by various manufacturers are defined on the basis of delay decision signal levels unique to the manufacturers. When the cells 26, 27 and the macro 30 are connected to each other as shown in FIG. 5, delay decision signal levels Vt of the cells 26, 27 and the macro 30 may differ from each other, resulting in delay time errors.

The delay time of a cell or a macro is defined as a period of time after an input signal applied thereto reaches a predetermined decision level Vt until an output signal produced thereby reaches the same decision level Vt. It is assumed, for example, that a decision level Vt1 of each of the cells 26, 27 is defined as about 20% of a high-level voltage and a decision level Vt2 of the macro 30 is defined as about 50% of the high-level voltage. Then, between the cell 26 and an input terminal IN of the macro 30, a time Δt1 between the decision levels Vt1, Vt2 of a signal 24 is left out of the delay time, and between an output terminal OUT of the macro 30 and the cell 27, a time Δt2 between the decision levels Vt1, Vt2 of a signal 25 is added to the delay time.

Since the slew rate of the signal 24 inputted to the input terminal IN of the macro 30 and the slew rate of the signal 25 inputted to the cell 27 vary depending on the value of a load capacitance connected thereto and the drive capability of a preceding stage, these slew rates cannot simply cancel out each other. Therefore, if the delay time of the macro 30 is defined by a decision level different from the decision level of the cells 26, 27, then the times Δt1, Δt2 cannot be acculately included for the calculation of a delay time, and the calculated delay time will be inaccurate.

Figure 6:
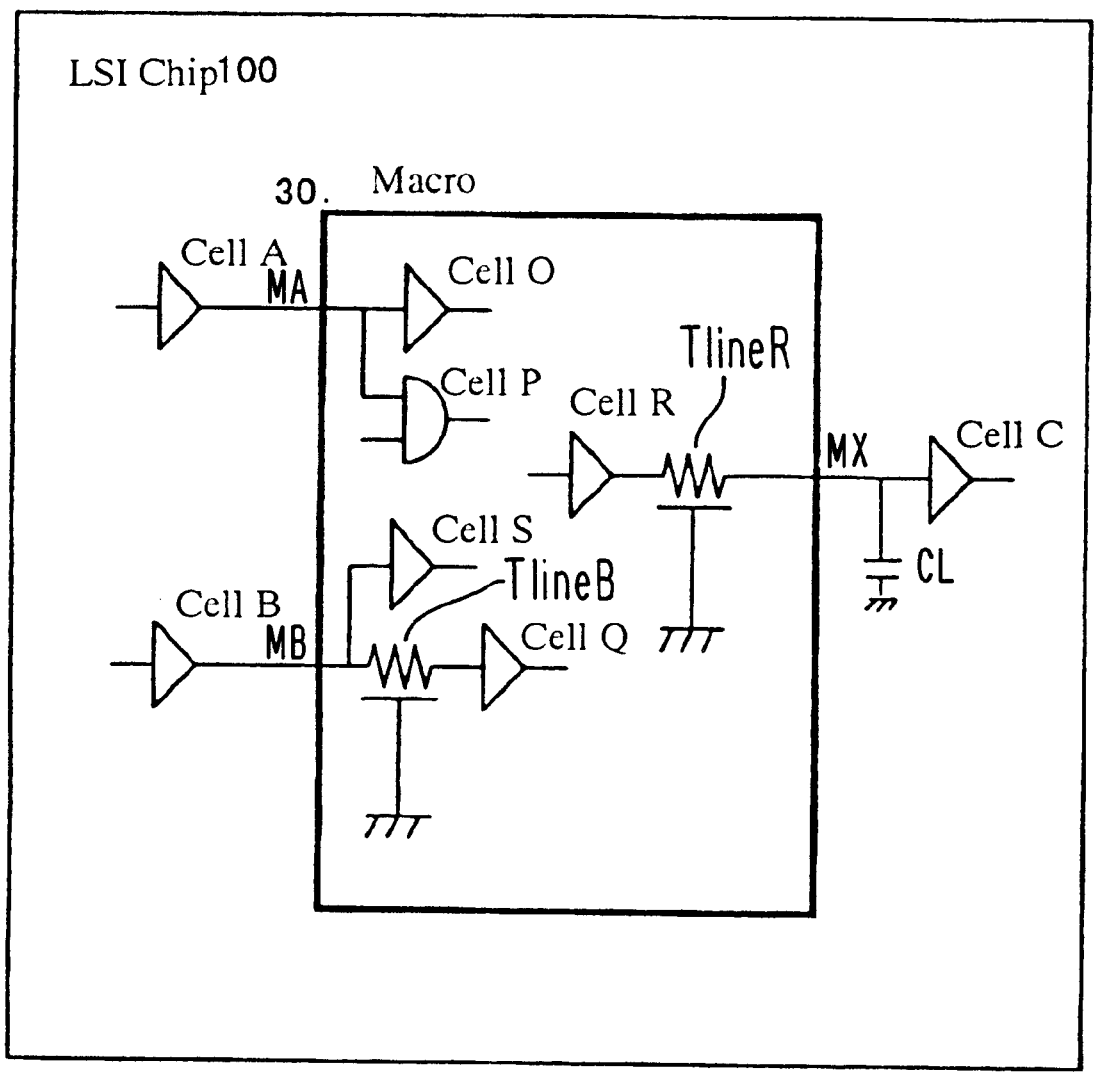
FIG. 6 is a block diagram illustrative of problems caused by the incorporation of a macro in an LSI chip.

FIG. 6 is illustrative of problems caused by the incorporation of a macro in an LSI chip. In FIG. 6, cells A, B, C and a macro 30 are connected to each other in an LSI chip 100. For incorporating the macro 30 in the LSI chip 100, it is necessary to take into account not only the basic internal delay time of the macro 30, but also delay times depending on the slew rates of inputted signals at respective input terminals MA, MB, a delay time due to a load capacitance CL connected to an output terminal MX, and a delay time due to interconnections. Once inputted signals are buffered in the macro 30, they are delayed in the macro 30 by a fixed delay time, and hence the fixed delay time may invariably be registered as the basic internal delay time. The delay times depending on the slew rates of the inputted signals at the input terminals, the delay time due to the load capacitance CL at the output terminals, and the delay time due to the interconnections are variable elements depending on circuits external to the macro 30. The slew rates of the inputted signals applied to the input terminals MA, MB and the load capacitance CL connected to the output terminal MX are factors that can be determined only when the logic circuit is designed.

In FIG. 6, internal circuits of the macro 30 are shown by way of example. The internal circuits of the macro 30 as shown in FIG. 6 will be analyzed below. Firstly, cells O, P are connected to the input terminal MA. Therefore, it is necessary to determine whether parameters of a delay time or delay characteristics determined from the slew rate of the input signal are to be assigned to the cell O or the cell P. Parameters or delay characteristics for the calculation of a delay time at the input terminal MA need to be given as attribute data of the macro registered in the logic library. With respect to the input terminal MA shown in FIG. 6, however, it is not possible to determine whether parameters or delay characteristics are to be assigned to the cell O or the cell P. If parameters are assigned to one of the cells O, P, then the delay time of a path to the other cell will be inaccurate.

Secondly, with respect to the input terminal MB, since an interconnection TlineB extending to a cell Q in an initial stage of the macro 30 is long, it is necessary to give the delay of the interconnection TlineB as attribute data. However, the delay of the interconnection TlineB is unnecessary for a cell S, and is inappropriate as a parameter given to the input terminal MB.

Thirdly, if an interconnection TlineR between the output terminal MX and a cell R in a final stage is long, then it is necessary to give the delay of the interconnection TlineR as attribute data of the output terminal MX. Fourthly, if decision levels for determining the delay times of the cells A, B, C and the macro 30 differ from each other, as described above, then it is necessary to adjust the delay times because of such unmatched decision levels, as shown in FIG. 5.

As described above with respect to the four examples, when a macro is to be incorporated into an LSI chip, it is necessary to give attribute data needed to calculate delay times to input and output terminals of the macro irrespective of internal circuit details of the macro. However, as explained above, it is difficult to give attribute data properly.

Figure 7:
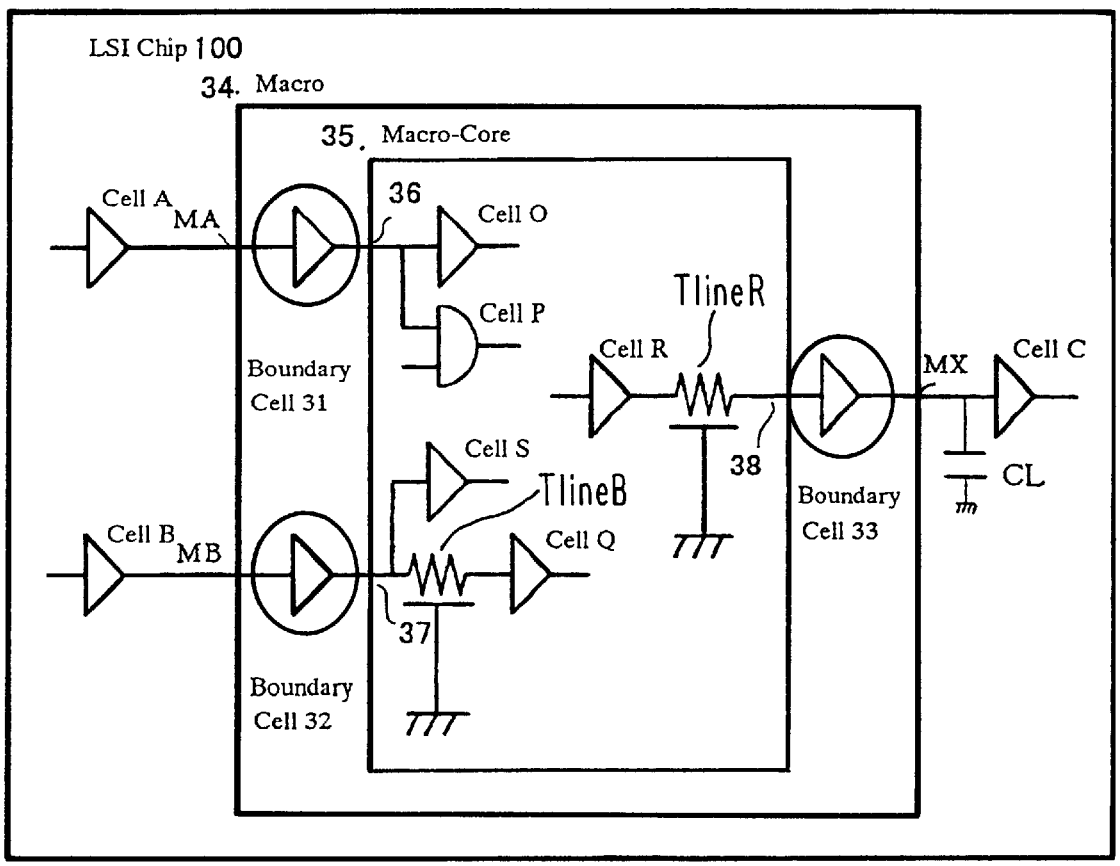
FIG. 7 is a block diagram showing a macro which is modeled according to the present invention.

FIG. 7 shows in block form a macro which is modeled according to the present invention. As shown in FIG. 7, the macro 30 shown in FIG. 6 is incorporated as a macro core 35, and the macro core 35 and boundary cells 31, 32, 33 connected to input terminals 36, 37 and an output terminal 38 of the macro core 35 jointly make up a macro 34 that, together with cells A, B, C, is incorporated in an LSI chip 100. For registering the macro 34 in the logic library, the macro 30 (FIG. 6) is handled as the macro core 35, and the macro 34 with the boundary cells 31, 32, 33 added as input first-stage cells and an output final-stage cell is registered. The boundary cells 31, 32, 33 are disposed near input terminals MA, MB and an output terminal MX of the macro 34 such that it will not be necessary to take into account delay times due to the lengths of interconnections in the input and output stages as explained above.

The arrangement shown in FIG. 7 offers various advantages. Firstly, by adding the boundary cells in the vicinity of the input terminals MA, MB and the output terminal MX and registering the macro 34, the input terminals of the macro 34 and the boundary cells are related to each other in one-to-one correspondence, and delay times depending on the slew rates of input signals can easily and accurately be calculated using characteristics of the boundary cells or characteristic parameters. Therefore, the problem that has been described above with reference to FIG. 6 as to whether the characteristics with respect to the input terminal MA is to be assigned to the cell O or the cell P is eliminated.

Secondly, by positioning the boundary cells in the vicinity of the terminals MA, MB, MX external to the macro core 35, the delay time caused by the interconnection TlineB from the external terminal MB to the cell Q in the first stage of the macro core 35 may be ignored in the calculation of a delay time depending on the slew rate of an input signal. The delay time caused by the interconnection TlineB between the terminal 37 of the macro core 35 and the cell Q does not depend on the slew rate of an input signal applied to the input terminal MB, but can simply be handled as a fixed delay time in the macro core 35. Since the delay time caused by the interconnection TlineB can be handled as a fixed delay time in the macro core 35, it can be isolated from the delay time in the boundary area of the macro 34. For the same reasons, the delay time caused by the interconnection TlineR can be ignored for the calculation of a delay time with respect to the output terminal MX.

Thirdly, decision levels for determining a delay time with respect to the boundary cells 31, 32 on the input side thereof are equalized to those for the cells A, B outside of the macro 34, and decision levels for determining a delay time with respect to the boundary cells 31, 32 on the output side thereof are equalized to those for the macro core 35. A decision level for determining a delay time with respect to the boundary cell 33 on the input side thereof is equalized to that for the macro core 35, and a decision level for determining a delay time with respect to the boundary cell 33 on the output side thereof is equalized to that for the cell C outside of the macro 34. By defining and adding the boundary cells, it is possible to eliminate inaccurate delay times due to unmatched decision levels Vt for delay times.

As described above, the boundary cells defined as described above are added to the macro 30 in the form of a black box thereby to create the new macro 34. Consequently, the internal circuit details of the macro 30 (the macro core 35) do not need to be taken into consideration, but delay characteristics (or characteristic data) introduced into the boundary area by the incorporated macro can be imparted as attribute data, so that accurate delay times can be calculated according to the attribute data.

The boundary cells are not limited to any specific types, but may comprise NAND gates, AND gates, NOR gates, OR gates, flip-flops, bidirectional cells, or other arbitrary circuits.

Figure 8:
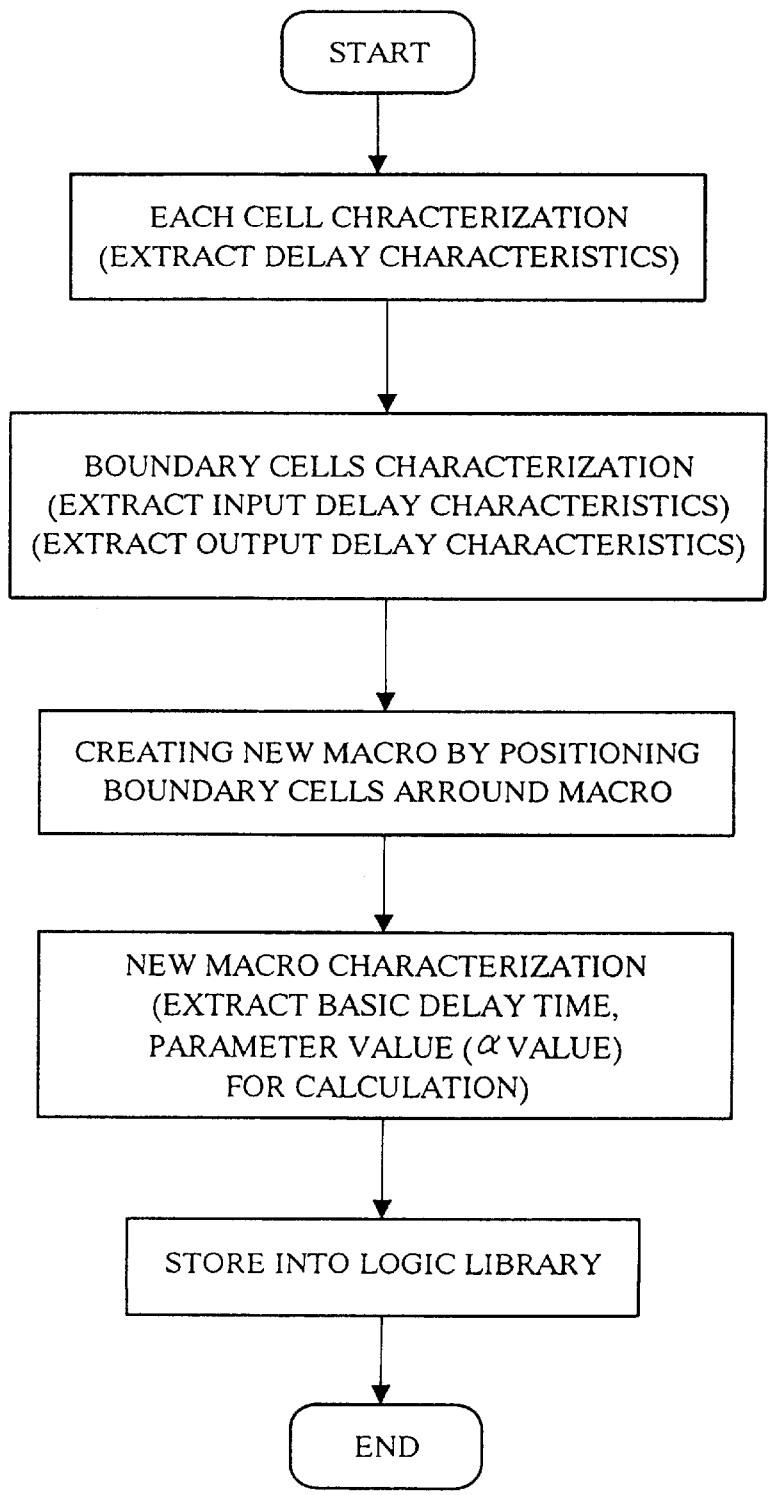
FIG. 8 is a flowchart of a process of generating a logic library.

FIG. 8 shows a flowchart of generating a logic library. The process shown in FIG. 8 is a detailed illustration of the step S9 shown in FIG. 1. Characteristics of a macro in the form of a black box are extracted (characterized) according to the concept described above.

In designing a logic circuit, cells and macros registered in a logic library are appropriately used. Then, according to attribute data registered in the logic library, delay times are calculated, and a logic simulation is conducted usually by the person who has designed the logic circuit. Therefore, it is necessary that the internal circuit details of a macro be given as a complete black box. It is also necessary that delay characteristics at an input terminal of the macro and drive capabilities (delay characteristics) at an output terminal of the macro are simply given as attribute data of those terminals.

Figure 9:
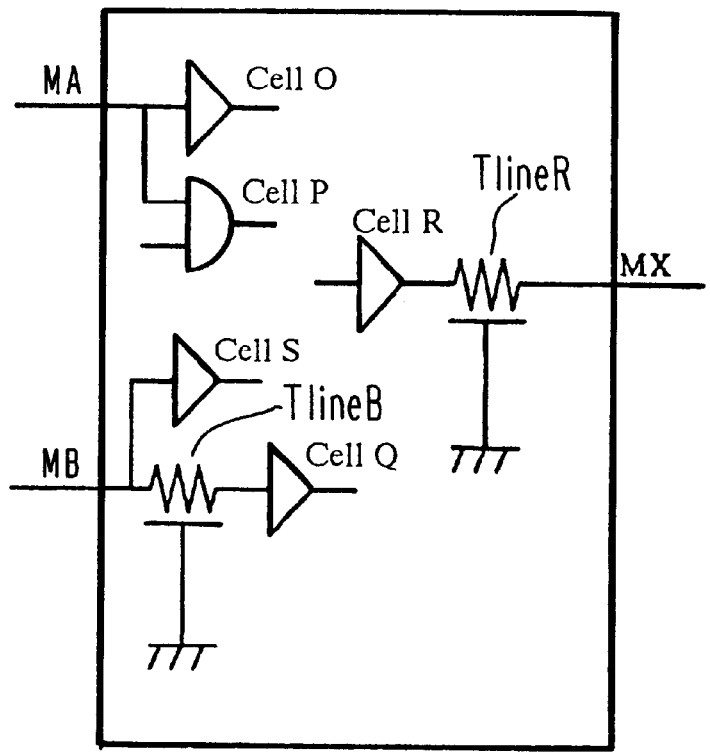
FIG. 9 is a block diagram showing a macro circuit by way of example.
Figure 10:
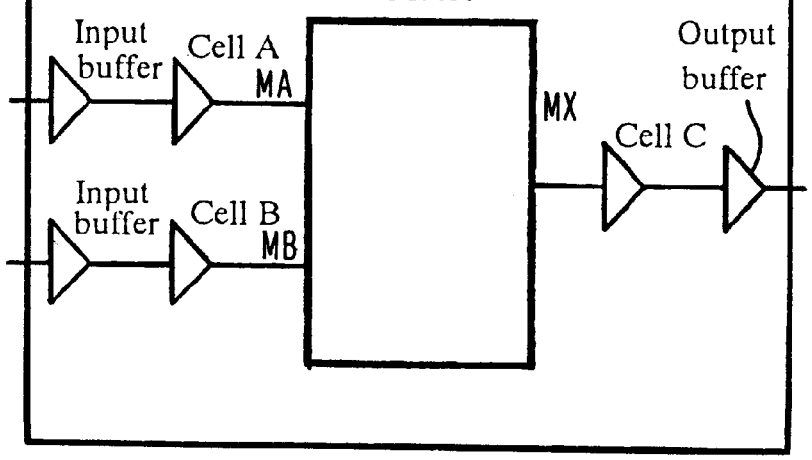
FIG. 10 is a block diagram showing an LSI chip by way of example.

It is assumed for the process shown in FIG. 8 that a logic circuit is designed to incorporate a macro 30 shown in FIG. 9, together with cells A, B, C, into an LSI chip 100 shown in FIG. 10. According to the present invention, therefore, a macro 34 shown in FIG. 10 which is registered in the logic library includes added boundary cells.

In a step S10 shown in FIG. 8, characteristics of cells for use in a logic circuit are extracted (characterized). Of those characteristics, characteristics required to calculate a delay time are given as a characteristic table as shown in FIG. 3B, or as a characteristic parameter (value $\alpha$). The characteristic table or the characteristic parameter is registered for each of input and output paths of a cell. Attribute data of a cell include logic data, an input terminal capacitance, an output drive capability, etc. as shown in FIG. 14, other than the characteristic table or the characteristic parameter.

Figure 11A:
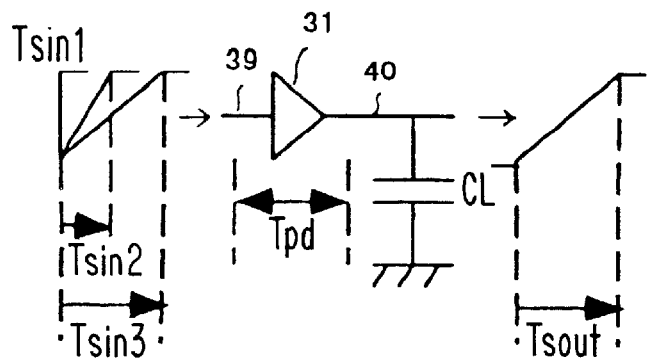
FIGS. 11(a) through 11(c) are diagrams illustrative of extracted characteristics of a boundary cell.
Figure 11B:
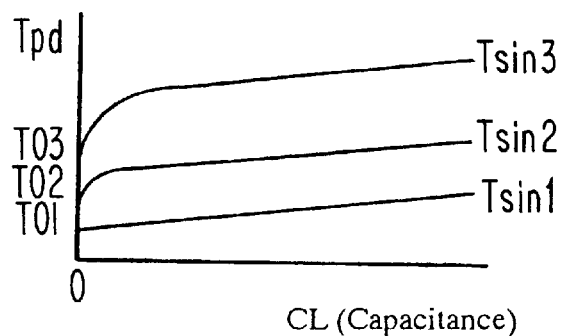
Figure 11C:
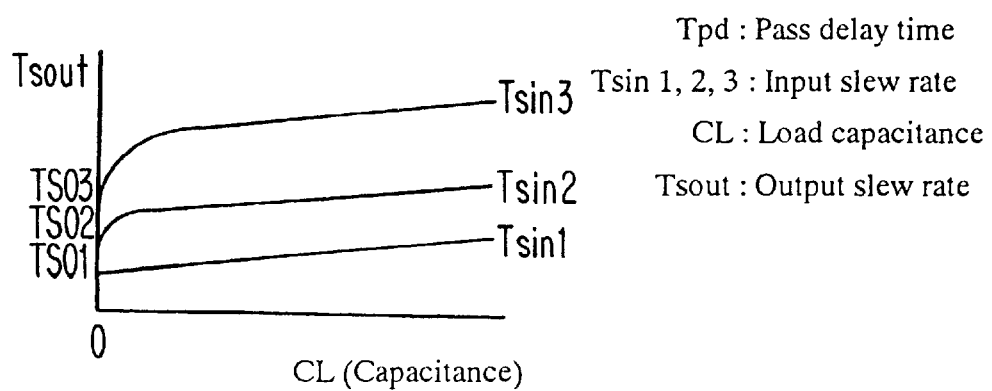

Then, characteristics of boundary macros added around the macro are extracted in order to extract the characteristics of the macro in a step S11. FIGS. 11A through 11C are illustrative of extracted characteristics of a boundary cell 31 which comprises a buffer. As shown in FIG. 11A, input signals having different slew rates Tsin1, Tsin2, Tsin3 (times required for the input signals to rise from a level L to a level H) are supplied to an input terminal 39 of the boundary cell 31, and a load capacitance CL is connected to an output terminal 40. Characteristics of a delay time Tpd (FIG. 11B) depending on the slew rates of the input signals, and characteristics of an output slew rate Tout (FIG. 11C) similarly depending on the slew rates of the input signals are extracted. These characteristics are extracted as characteristic parameters (value $\alpha$) for the calculation of a delay time.

With the characteristics being thus extracted, the delay time Tpd depending on the slew rates of the input signals can easily be calculated in the case where boundary cells are connected to the input terminals of the macro, and the slew rate of an input signal supplied to a next cell outside of the macro can be determined in the case where a boundary cell is connected to the output terminal of the macro.

Figure 12A:
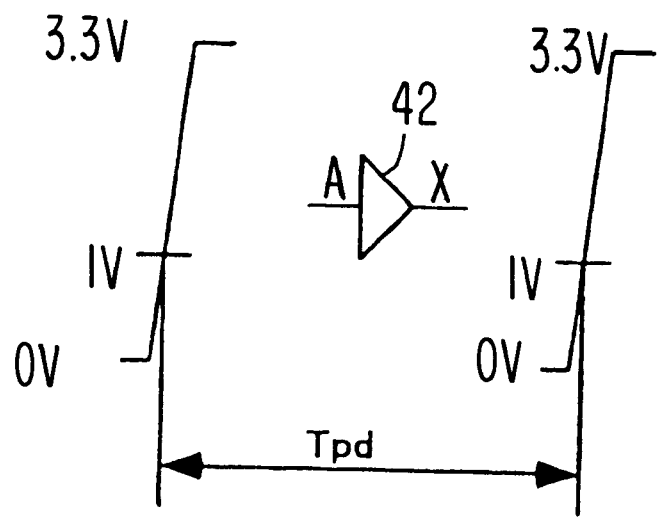
FIGS. 12(a) and (b) are diagrams illustrative of decision levels for determining a cell delay time and a macro delay time.
Figure 12B:
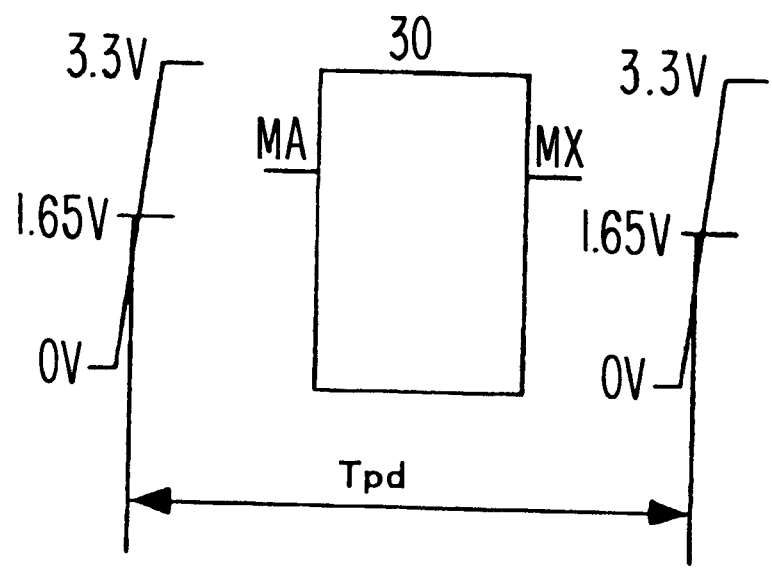

The delay time Tpd is extracted with the decision level being equalized to a decision level of a preceding or following stage which is connected to the macro. For example, FIGS. 12A and 12B show decision levels for determining a delay time of a cell 42 outside of the macro 30 in the LSI chip 100, and a delay time of the macro 30. Specifically, as shown in FIG. 12A, both input and output voltage levels for determining the delay time Tpd of the cell 42 are equal to 1 V, and as shown in FIG. 12B, both input and output voltage levels for determining the delay time Tpd of the macro 30 are equal to 1.65 V.

Figure 13A:
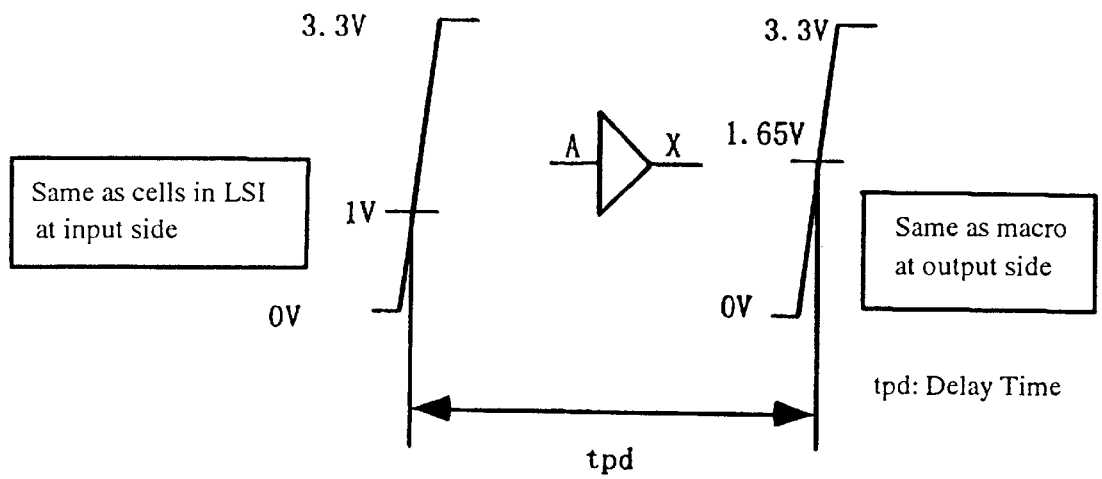
FIGS. 13(a) and 13(b) are diagrams illustrative of decision levels for determining boundary cell delay times.
Figure 13B:
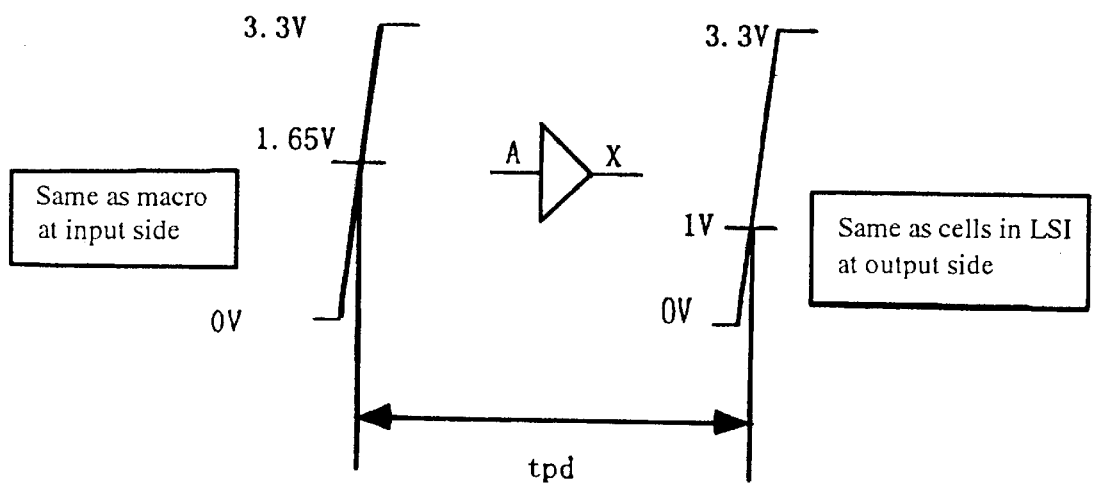

FIGS. 13A and 13B show decision levels for determining boundary cell delay times. In FIG. 13A, a boundary cell is connected to an input terminal of the macro, and a decision level for an input signal is set to 1 V, which is a decision level for the cell 42, and a decision level for an output signal is set to 1.65 V which is a decision level for the macro 30. As a result, the delay time Tpd thus is defined as the characteristics shown in FIG. 11B. In FIG. 13B, a boundary cell is connected to the output terminal of the macro, and a decision level for an input signal is set to 1.65 V, which is a decision level for the macro 30, and a decision level for an output signal is set to 1 V, which is a decision level for the cell 42.

After the characteristics of boundary macros are extracted, the boundary macros are positioned around the macro 30, creating a new macro in a step S12, i.e., producing the macro 34 shown in FIG. 7. The input boundary macros 31, 32 are added between the input terminals 36, 37 of the macro core 35 and the input terminals MA, MB of the macro 34, and the output boundary cell 33 is added between the output terminal 38 of the macro core 35 and the output terminal MX of the macro 34. As described above, the boundary cells 31, 32, 33 are positioned in the vicinity of the input terminals MA, MB and the output terminal MX. In a step S13, characteristics of the new macro 34 with the boundary cells 31, 32, 33 added thereto are extracted (characterized). Those characteristics which are used in the calculation of a delay time of the macro are characteristic parameters of delay times that depend on the slew rates of input signals shown in FIG. 11B. The characteristic parameters are given as attribute data to each of the input terminals MA, MB. The characteristic parameters given to the output terminal MX are characteristics shown in FIG. 11B, and are also characteristics of the slew rates of output signals shown in FIG. 11C. These characteristics are given as attribute data of an output drive capability to the output terminal MX.

FIG. 14 shows a data structure of attribute data of the cells A, B, C and the macro D(34) stored in a logic library. The attribute data of the macro include a basic delay time D4 independent of the slew rates of input signals, in addition to the characteristic parameter D2 and the output drive capability D3. In FIG. 14, D1 represents logic data of the macro D, which is attribute data used in a logic simulation. When the attribute data of the macro shown in FIG. 14 is given, the attribute data is stored as a logic library in the file 11 in a step S14 (see FIG. 8). The file 11 may be implemented by a magnetic tape, a magnetic disk, a magneto-optical disk, a semiconductor memory, or the like, insofar as it is a recording medium that can be read by a computer.

Referring back to FIG. 1, when a logic circuit is designed with macros and cells registered in the logic library in the step S1, delay times in the designed logic circuit are calculated according to the delay time calculation program. Since the macro 34 is registered in the logic library, the delay times in the logic circuit can be calculated simply and accurately. The macro 34 can be handled as a black box without concern with internal circuit details thereof. Specifically, inasmuch as characteristic parameters for determining delay times depending on input parameters are given as attribute data to the input terminals MA, MB, delay times can simply be calculated according to the characteristic parameters. Furthermore, because characteristics of a delay time (load dependency) of a drive capability with respect to a load connected to the output terminal MX and characteristics of the slew rate of an output signal are given as attribute data to the output terminal MX, an increase in the delay time caused by the load connected to the output terminal MX and the slew rate of an input signal supplied to the cell C in the next stage connected to the output terminal MX can be easily calculated.

The delay times of input boundary cells depending on the slew rates of input signals, and the increase in the delay time due to the load connected to the output terminal are added to the basic delay time D4 of the macro, thus determining the overall delay time of the macro 34. Thereafter, the logic simulation in the step S3, the chip layout generating process in the step S4, the resistance and capacitance value extracting process in the step S5, the delay time calculating process in the step S6, the logic simulation in the step S7, and then the LSI circuit manufacturing process in the step S8 are successively carried out.

When the LSI circuit which has incorporated the macro with the added boundary cells is completed, the boundary cells are positioned in the vicinity of the input and output terminals of the macro.

With the arrangement of the present invention, as described above, boundary cells are added in one-to-one correspondence to input and output terminals around a macro, and their characteristics are extracted as macro characteristics. Therefore, attribute data including characteristic parameters of input terminals, a drive capability of an output terminal, etc. can be easily be assigned. When the macro is read from the logic library for designing a logic circuit, it greatly simplifies the subsequent process of calculating delay times and allows delay times to be calculated highly accurately.

Although a certain preferred embodiment of the present invention has been shown and described in detail, it should be understood that various changes and modifications may be made therein without departing from the scope of the appended claims.

What is claimed is:

1. A method of manufacturing an integration circuit device, comprising the steps of:

generating logic library data with respect to a macro that includes a macro core having a predetermined function and boundary cells positioned near input and output terminals of the macro core, wherein an input terminal is connected to a plurality of first cells of the macro core, or the input or output terminals of the macro core are connected to a first cell of the macro core via a substantial delay line, said logic library data including delay characteristic data of the boundary cells given as attribute data to input and output terminals of the macro;

designing a logic circuit having at least a plurality of second cells and said macro, said plurality of second cells being connected to the input and output terminals of the macro so as to be connected to the input and output terminals of the macro core through the boundary cells;

calculating a delay time of the macro based on said delay characteristic data with respect to the designed logic circuit; and effecting a logic simulation of the designed logic circuit based on the calculated delay time.

2. A method according to claim 1, wherein said delay characteristic data comprises data of delay time characteristics depending on a slew rate of an input signal.

3. A method according to claim 2, wherein said data of delay time characteristics comprises a characteristic parameter required to calculate the delay time.

4. A method according to claim 2, wherein said data of delay time characteristics comprises delay time characteristics matched to a decision level for determining a delay time of one of said plurality of second cells which is connected to the input terminal and a decision level for determining a delay time of said macro core.

5. A method according to claim 1, wherein said delay characteristic data comprises data of an output drive capability.

6. A method according to claim 5, wherein said data of the output drive capability comprises data of a slew rate of an output signal depending on a slew rate of an input signal and a load capacitance, and a delay time depending on a slew rate of the input signal and the load capacitance.

7. A method according to claim 5, wherein said data of the output drive capability comprises delay time characteristics matched to a decision level for determining a delay time of one of said plurality of second cells which is connected to the output terminal and a decision level for determining a delay time of said macro core.

8. An integration circuit device comprising:
   a plurality of cells; and
   a macro having a predetermined function;
   said macro comprising:
      a plurality of input terminals and output terminals;
      a macro core having said predetermined function; and
      a plurality of boundary cells positioned between said input terminals, said output terminals, and said macro core, and connected to said input terminals and said output terminals, wherein
   said plurality of cells are connected to said macro core through said boundary cells.

9. A storage medium storing a logic library readable by a computer, comprising:
   a plurality of cells having cell data; and
   a macro having macro data, wherein
      said cell data includes, as attribute data, logic data, data of delay time characteristics depending on slew rates of input signals, and data of output drive capabilities,
      said macro includes a macro core having a predetermined function, input and output terminals, and boundary cells added near said input and output terminals, and
      said macro data includes, as attribute data, logic data, data of delay time characteristics depending on a slew rate of an input signal supplied to a boundary cell connected to the input terminal, and data of a drive capability of a boundary cell connected to the output terminal.

* * * * *

UNITED STATES PATENT AND TRADEMARK OFFICE
CERTIFICATE OF CORRECTION

PATENT NO.:    6,012,833
DATED     :    January 11, 2000
INVENTOR(S):   Satoru YOSHIKAWA It is certified that [an/error[s]] appears in the above-identified patent and that said Letters Patent is hereby corrected as shown below:

```
Title page , item
```
[54] Title:

Change "Large-Scale-Integration Circuit Device And Method of Manufacturing Same" to --Large Scale Integration Circuit Device And Method of Manufacturing Same--.

Signed and Sealed this

Twenty-first Day of November, 2000

*Attest:*

Q. TODD DICKINSON

*Attesting Officer*      *Director of Patents and Trademarks*

UNITED STATES PATENT AND TRADEMARK OFFICE
CERTIFICATE OF CORRECTION

PATENT NO. : 6,012,833
DATED : January 11, 2000
INVENTOR(S) : Satoru YOSHIKAWA

It is certified that error appears in the above-identified patent and that said Letters Patent is hereby corrected as shown below:

On the title page item;

[30] "Feb. 24, 1997 [JP] Japan ...9-03832" should be deleted.

Signed and Sealed this

Thirtieth Day of January, 2001

*Attest:*

Q. TODD DICKINSON

*Attesting Officer*     *Director of Patents and Trademarks*